United States Patent [19]

Ikeda et al.

[11] Patent Number: 5,052,033
[45] Date of Patent: Sep. 24, 1991

[54] REFLECTION TYPE MASK

[75] Inventors: Tsutomu Ikeda; Yutaka Watanabe; Masayuki Suzuki; Masami Hayashida, all of Atsugi; Yasuaki Fukuda, Hadano; Shigetaro Ogura, Tama; Takashi Iizuka; Masahito Niibe, both of Atsugi, all of Japan

[73] Assignee: Canon Kabushiki Kaisha, Tokyo, Japan

[21] Appl. No.: 633,181

[22] Filed: Dec. 28, 1990

Related U.S. Application Data

[63] Continuation of Ser. No. 156,934, Feb. 17, 1988, abandoned.

[30] Foreign Application Priority Data

| Feb. 18, 1987 | [JP] | Japan | 62-33523 |
| Dec. 29, 1987 | [JP] | Japan | 62-335220 |
| Dec. 29, 1987 | [JP] | Japan | 62-335221 |
| Dec. 29, 1987 | [JP] | Japan | 62-335222 |
| Dec. 29, 1987 | [JP] | Japan | 62-335223 |
| Jan. 22, 1988 | [JP] | Japan | 63-12136 |

[51] Int. Cl.$^5$ ............................................. G21K 5/00
[52] U.S. Cl. .................................. 378/35; 378/34; 378/84
[58] Field of Search ........................ 378/34, 35, 84; 250/492.2

[56] References Cited

U.S. PATENT DOCUMENTS

| 4,411,013 | 10/1983 | Takasu et al. | 378/35 |
| 4,693,933 | 9/1987 | Keen et al. | 378/84 |
| 4,923,772 | 5/1990 | Kirch et al. | 378/35 |

FOREIGN PATENT DOCUMENTS

| 0055077 | 6/1982 | European Pat. Off. |
| 0252734 | 1/1988 | European Pat. Off. |
| WO87/06028 | 10/1987 | PCT Int'l Appl. |

OTHER PUBLICATIONS

Underwood et al., "The Renaissance of X-Ray Optics", Physics Today, pp. 44–52, Apr. 1984.
Spiller, "Low Loss Reflection Coatings Using Absorbing Materials," Appl. Phys. Lett., vol. 20, No. 9, May 1972, pp. 365–367.
Vidal et al., "Metallic Multilayers for X-Rays Using Classical Thin-Film Theory," App. Optics, vol. 23, No. 11 (Jun. 1984), pp. 1794–1801.
Matsumura et al., "Demagnified Projection Printing by a New X-Ray Lithographic Technique Using No Thin-Film Masks", Appl. Phys. Lett., vol. 45, No. 1, Jul. 1984, pp. 3–5.
Patent Abstracts of Japan, vol. 10, No. 19, Kokai 60-173,551, Sep. 1985.
Matsumura, "Theoretical Consideration on New Reflection Type X-Ray Lithography", Extended Abstract of the 18th Conference on Solid Stage Devices and Materials, Tokyo, 1986, pp. 17–20.

Primary Examiner—Carolyn E. Fields
Assistant Examiner—David P. Porta
Attorney, Agent, or Firm—Fitzpatrick, Cella, Harper & Scinto

[57] ABSTRACT

A reflection type mask usable to print a pattern upon a semiconductor wafer by use of soft X-rays or otherwise is disclosed. A reflective surface is formed by a multi-layered film which is formed on a substrate by layering different materials having different refractive indices in consideration of Bragg diffraction and Fresnel reflection. A non-reflective portion is formed on the reflecting surface to provide a desired pattern. Alternatively, a pattern comprising a multilayered structure may be formed upon a non-reflective substrate. The mask of the present invention assures pattern printing of high contrast.

30 Claims, 6 Drawing Sheets

REFLECTION TYPE MASK

This application is a continuation of prior application, Ser. No. 07/156,934 filed Feb. 17, 1988, now abandoned.

FIELD OF THE INVENTION AND RELATED ART

This invention relates to a reflection type mask usable in the manufacture of semiconductor devices such as integrated circuits, large scaled integrated circuits, etc. More particularly, the invention is concerned with a reflection type mask suitably usable with an exposure apparatus that uses, for exposure of workpieces such as wafers, a radiation energy such as X-rays of a wavelength in the range of 5Å–300Å or vacuum ultraviolet rays of the wavelength in the range of 300Å–2000Å (hereinafter, these rays will be referred to as "soft X-rays").

It has been considered to use a reflection type mask with a projection exposure of the type using soft X-rays to print a pattern on a wafer. It may be considered to manufacture such a reflection type mask, particularly a reflective portion thereof, in the following two ways:

One is to use a natural crystal (single crystal) to provide a reflecting surface. The other is to grind the surface of a substrate to provide a total reflection mirror.

The former utilizes a Bragg diffraction of the natural (single) crystal. Thus, when radiation of a wavelength of 100Å is used, it is necessary to use a natural crystal having a grating constant not less than 50Å, according to the Bragg diffraction theory $2d \sin\theta = \lambda$ where $d$ is the thickness, $\lambda$ is the wavelength and $\theta$ is the angle defined between the incident ray and the substrate. It is very difficult to obtain such a crystal. If, on the other hand, an ordinarily available natural crystal as having a grating constant in the range of 1.5–5Å is used, the wavelength must be on an order of 5Å. However, at present, there is no resist material that has a sufficient sensitivity to such a very short wavelength range.

The latter utilizes the theory of total reflection by a mirror surface. However, because of the limitation of the material usable, the limitation of the ambient conditions and so on, a large critical angle such as on an order of 86–87 degrees has to be used. This means that the X-rays should be incident exceedingly inclinedly.

SUMMARY OF THE INVENTION

It is an object of the present invention to provide a reflection type mask which can be manufactured easily and at a reduced cost.

It is another object of the present invention to provide a reflection type mask which can assure high resolution and contrast in the transfer of a pattern of mask onto a workpiece.

Briefly, in accordance with one aspect of the present invention, there is provided a reflection type mask wherein a reflective base portion provided by a multi-layered film is formed on a substrate. On such a reflective base portion, non-reflective elements made of an absorptive material or an anti-reflection film of multi-layered structure are formed to provide a pattern.

According to another aspect of the present invention, there is provided a reflection type mask wherein the surface of a non-reflective substrate is patterned with reflective elements each being provided by a multilayered film.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

In accordance with an aspect of the present invention, a reflection surface of a mask is provided by a reflective portion having a multilayered structure. Briefly, in the present invention, the Fresnel reflection theory is used to improve the reflection efficiency at the interfaces of the layers and, additionally, the Bragg diffraction theory is used so that the reflected lights from the interfaces of the layers interfere with each other to mutually strengthen the intensity. The thickness of each layer is determined so as to satisfy these conditions.

Details of the theory of reflection in a multilayered structure are fully discussed in "Low-Loss Reflection Coatings Using Absorbing Materials" by Eberhard Spiller ("Appl. Phys. Lett." Vol. 20, No. 9, May 1972) and "Metallic Multilayers for X-rays Using Classical Thin-Film Theory" by B. Vidal and P. Vincent ("Applied Optics" Vol. 23, No. 11/1, June 1984).

In the multilayered structure of the present invention, the materials of the layers and the thicknesses of the layers are selected and determined so as to meet the Bragg diffraction and the Fresnel reflection:

$$nd \cos\theta = \lambda N/2 \tag{1}$$

wherein $d$ is a grating constant (film thickness), $\theta$ is the angle of incidence, $\lambda$ is the wavelength, $N$ is an integral number and $n$ is the refractive index; and $$\{(N_1-N_2)/(N_1+N_2)\}^2 \quad (2)$$
(Fresnel reflection factor)

wherein $N_1$ and $N_2$ are refractive indices of the materials of the multilayered film, each of which can be expressed by "$N = n + ik$" (where n represents the real number portion while ik represents the imaginary number portion) with respect to the wavelength region of X-rays or ultraviolet rays.

Figure 1:
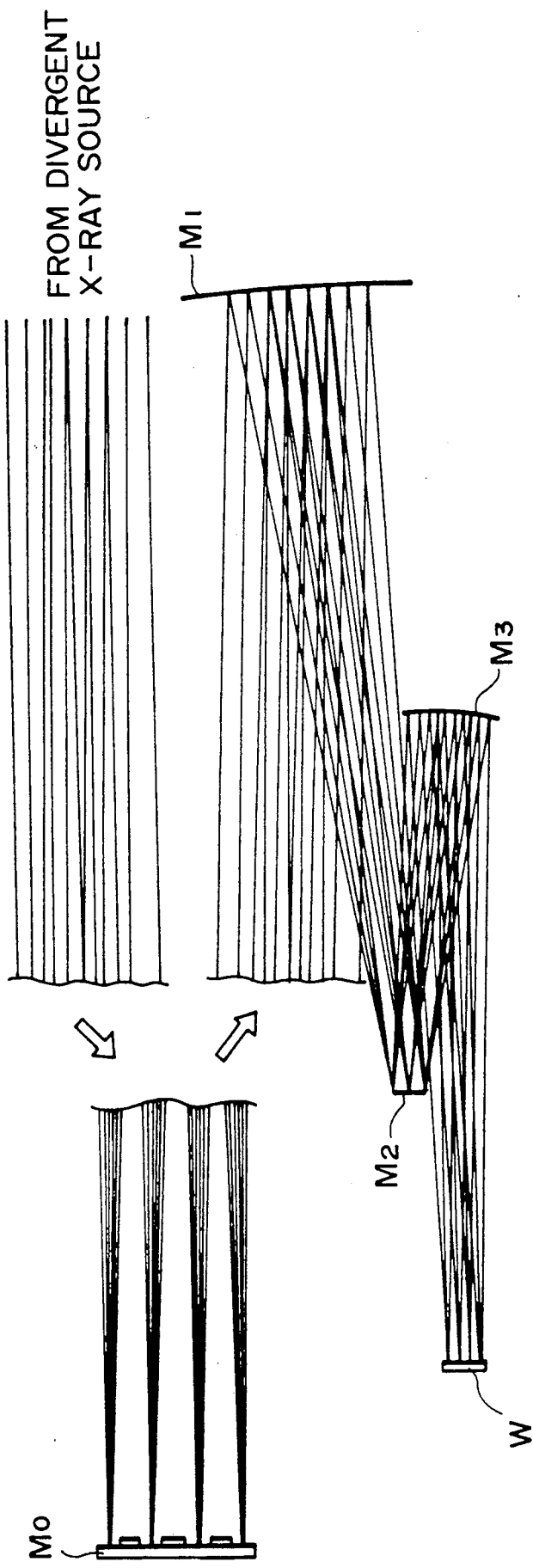
FIG. 1 is a schematic view of an optical path of a projection optical system suitably usable with a reflection type mask according to the present invention.

FIG. 1 shows a projection optical system of an X-ray exposure apparatus which may be used with a reflection type mask of the present invention so as to print, by projection exposure, a pattern of the mask upon a semiconductor wafer in a reduced scale. As illustrated, the projection system includes three mirrors M1, M2 and M3 each being adapted to reflect soft X-rays in this example. The first and third mirrors M1 and M3 have concave mirror surfaces, respectively, while the second mirror M2 has a convex mirror surface. Details of such a projection optical system usable in an X-ray exposure apparatus are disclosed in U.S. patent application Ser. No. 070,779 filed July 7, 1987 and assigned to the same assignee of the subject application.

Figure 2:
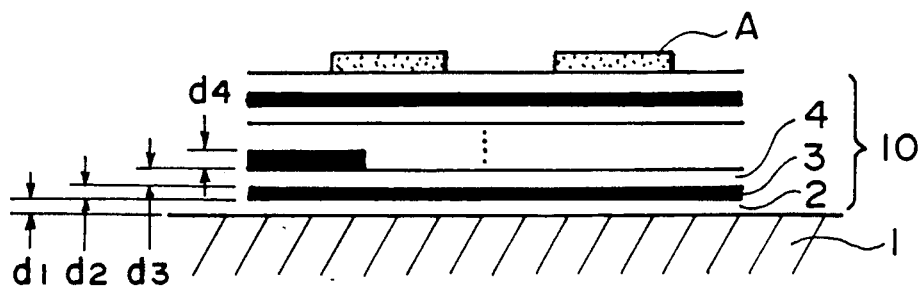
FIG. 2 is a schematic section showing the structure of a reflection type mask according to a first embodiment of the present invention.

FIG. 2 shows a reflection type mask according to a first embodiment of the present invention. The mask of this embodiment may be suitably usable with radiation of wavelength 124Å as the printing radiation.

The mask includes a substrate 1 which may be formed by a silicon single crystal plate having a ground surface having surface roughness not larger than 10Å (rms). On the surface of the substrate 1, a large number of layers are formed, although only some of which are shown in the drawing for ease in illustration. In this embodiment, two different materials are used for these layers, in an alternating fashion. More specifically, first type layers 2, 4 ..., are made of ruthenium (Ru) having a refractive index $N = 0.91 + 6.8 \times 10^{-3}i$. Second type layers 3, 5 ..., are made of silicon carbide (SiC) having a refractive index $N = 1.02 + 3.7 \times 10^{-3}i$. The first type layers and the second type layers are formed alternately, as illustrated, to provide a reflective base portion 10 of multilayered structure.

Figure 3A:
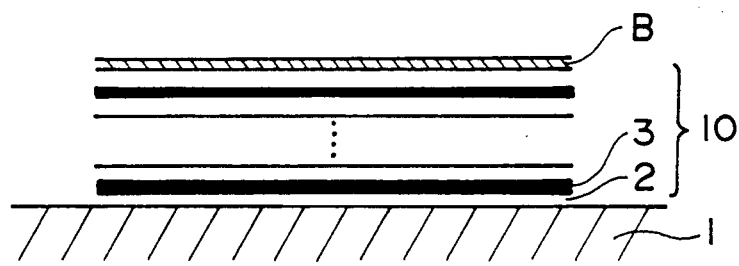
FIGS. 3A–3C are schematic sections, respectively, for explaining the process of manufacture of the mask of the first embodiment.

In a particular example, the first type layers and the second type layers were made by sputtering deposition after a super high vacuum not greater than $1 \times 10^{-6}$ Pa was achieved and with an argon pressure of $5 \times 1^{-1}$ Pa. Each of the first type layers had a thickness of 29.8Å while each of the second type layers had a thickness of 33.9Å. Forty-one layers comprising twenty-one of the first type layers and twenty of the second type layers were formed on the substrate. Additionally, a surface layer of carbon (C) was formed with a thickness 10Å upon the top layer as a protection film B (FIG. 3A), whereby a reflective base portion of multilayered structure was obtained. It is preferable that the first type layers have a refractive index whose real number portion is smaller while the second type layers have a refractive index whose real number portion is larger. This is because, as will be readily understood from the Fresnel reflection theory, such a material whose refractive index has a large difference from that of an ambience, such as air, should preferably be used as the material of the final layer.

The thickness of each layer can be determined in accordance with the aforementioned Bragg diffraction formula and on the basis of the refractive index of each material and the wavelength of the radiation to be used.

In the present embodiment, for example, the thickness can be determined as follows:

From the aforementioned Bragg diffraction formula (1), it follows that:

$$2(n_1 d_1 + n_2 d_2)\cos\theta = (2M)\lambda/2 \quad (3)$$

wherein $n_1$ and $n_2$ are refractive indices of the materials used, $d_1$ and $d_2$ are the thicknesses of the layers of different materials, $\lambda$ is the wavelength of radiation to be used, and m is an integral number. When the angle of incidence is zero (i.e. the regular or perpendicular incidence), then $\cos\theta = 1$. Therefore, equation (3) can be rewritten as follows:

$$n_1 d_1 + n_2 d_2 = \lambda(m)/2$$

Considering the optical path length with regard to each individual layer, then:

$2n_1 d_1 = \lambda/2$, thus $$d_1 = \lambda/4n_1 \quad (4)$$

and $2n_2 d_2 = \lambda/2$, thus $$d_2 = \lambda/4n_2 \quad (5)$$

Accordingly, by satisfying the equation (4) or (5), the thickness of each layer can be determined. In the present embodiment:

$$n_1 = 0.91 + 6.8 \times 10^{-3}i$$

$$n_2 = 1.02 + 3.7 \times 10^{-3}i$$

$$\lambda = 124\text{Å}$$

Since the imaginary number portion is very small as compared with the real number portion, it may be considered as "zero". By substituting these values into equations (4) and (5), the thicknesses can be determined as follows:

$$d_1 \approx 29.8\text{Å}$$

$$d_2 \approx 33.9\text{Å}$$

Figure 3B:
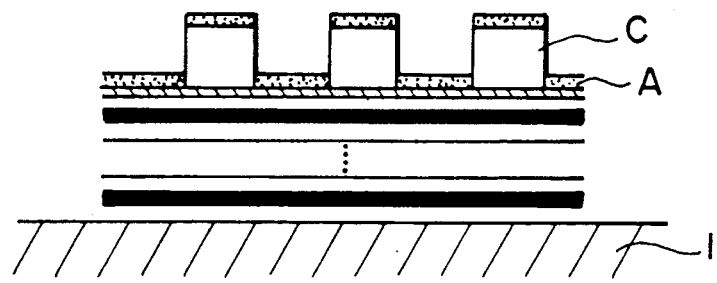
Figure 3C:
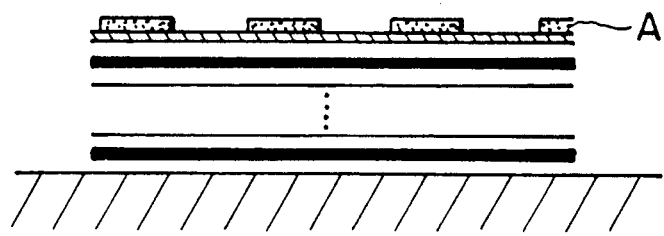

In the particular example described hereinbefore, after the reflective base portion of the multilayered structure was obtained, a resist layer of an PMMA was formed on the reflective base portion with a thickness 0.5 micron. Subsequently, by use of electron-beam patterning process, the resist layer was patterned with 1.75 micron line-and-space. Then, gold (linear expansion coefficient: $1.42 \times 10^{-5}$/deg and heat conductivity: 3.16 J/cm.s.deg) was deposited on the resist layer, by electron beam deposition and with a thickness of 0.1 micron (FIG. 3B). As is well known in the art, gold is a material that can absorb soft X-rays. Subsequently, the PMMA material was removed, whereby a gold pattern A was obtained on the multi-layered film (see FIG. 3C).

Another example of the first embodiment will now be described. The mask of this example may be suitably used with radiation having a wavelength of 124Å and with an angle of incidence $\lambda = 0$ (degree).

As in the foregoing example, a ground silicon single crystal plate 1 was used. As the material of the first type layers 2, 4, ..., tantalum nitride (TaN) having a refractive index $N = 0.96 + 3.7 \times 10^{-2}i$ was used. On the other hand, as the material of the second type layers 3, 5, ..., silicon (Si) having a refractive index $N = 1.03 + 1.5 \times 10^{-3}i$ was used. After a super high vacuum not greater than $1 \times 10^{-6}$ Pa was achieved, forty-one layers (twenty-one layers of TaN and twenty layers of Si) were formed with respective thicknesses 20.3Å and 40.6Å, by sputtering deposition while retaining an argon pressure $5 \times 10^{-1}$ Pa. Additionally, upon the top layer, a layer of carbon (C) was formed with a thickness of 10Å as a protection film B. In this example, the first type layers have a refractive index whose real number portion is smaller, while the second type layers have a refractive index whose real number portion is larger. The thickness of each of the first type layer and the second type layer can be determined in accordance with equation (1) related to the Bragg diffraction, as described hereinbefore.

A PMMA layer of a thickness 0.5 micron was formed on the thus obtained reflective base portion of multilayered structure, and the PMMA layer was patterned by an electron-beam patterning process. On the resultant PMMA pattern, tantalum (Ta) (linear expansion coefficient: $6.3 \times 10^{-6}$/deg and heat conductivity: 0.575 J/cm.s.deg) which is a soft X-ray absorbing material was deposited by electron-beam deposition with a thickness 0.1 micron. Subsequently, the PMMA material was removed, such that a tantalum pattern was obtained on the multilayered film.

Description will now be made of a third example of the first embodiment. The mask of this example may be suitably used with radiation having a wavelength of 124Å and with an angle of incidence $\theta = 0$ (degree).

As in the first example, a ground silicon single crystal plate was used. As for the material of the first type layers 2, 4, ..., palladium (Pd) having a refractive index $N = 0.90 + 2.4 \times 10^{-2}i$ was used. As the material of the second type layers 3, 5, ..., silicon (Si) having a refractive index $N = 1.03 + 1.5 \times 10^{-3}i$ was used. In a super high vacuum not greater than $1 \times 10^{-6}$ Pa, forty-one layers (twenty-one layers of Pd and twenty layers of Si) were formed on the substrate by electron-beam deposition, with respective thicknesses of 21.1Å and 40.3Å. Further, a layer of carbon (C) of a thickness 10Å was formed thereupon as a protection film. In this example, the first type layers have a refractive index whose real number portion is smaller and the second type layers have a refractive index whose real number portion is larger.

Subsequently, a PMMA layer of a thickness 0.5 micron was formed on the thus obtained reflective base portion of multilayered structure, and, then, the PMMA layer was patterned by an electron-beam patterning process. On the thus formed PMMA pattern, silicon (Si) (linear expansion coefficient: $2.6 \times 10^{-6}$/deg and heat conductivity: 149 J/cm.s.deg) which is a soft X-ray absorbing material was deposited by electron-beam deposition to a thickness of 0.1 micron. Subsequently, the PMMA material was removed, with the result that a silicon pattern was obtained on the multilayered film.

While, in these examples, a silicon single crystal plate is used as the substrate, the material is not limited thereto. For example, a glass plate, a fused silica plate, a silicon carbide plate or otherwise may be used, provided that its surface is sufficiently made smooth, by grinding, as compared with the wavelength of radiation to be used.

Figure 4:
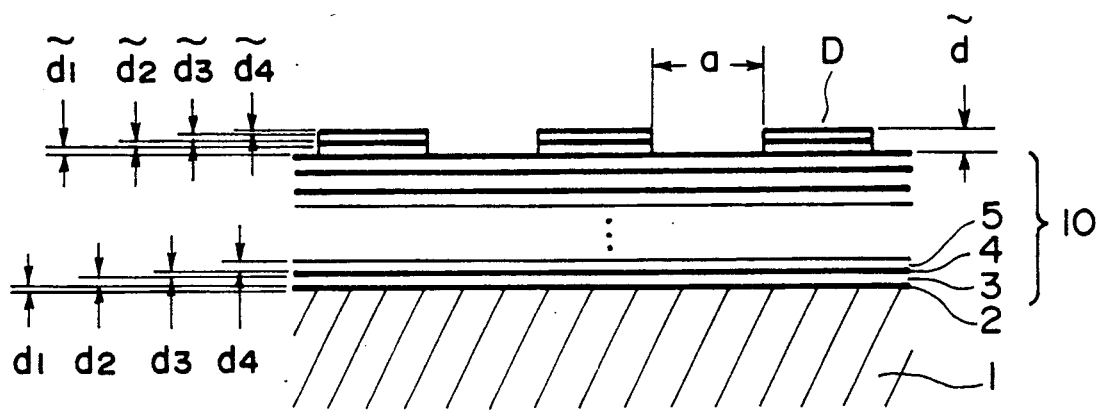
FIG. 4 is a schematic section showing the structure of a reflection type mask according to a second embodiment of the present invention.
Figure 5:
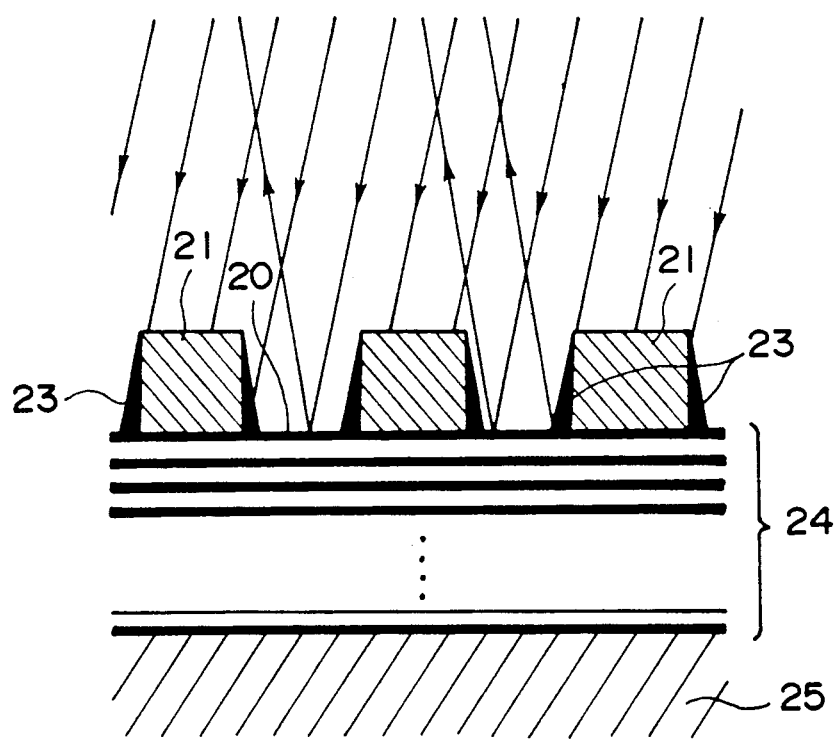
FIG. 5 is a schematic section for explaining the problem of half shade.

FIG. 4 shows a reflection type mask according to a second embodiment of the present invention. FIG. 5 is a schematic illustration for explaining a problem which can be solved by the present embodiment.

In a case wherein a printing light such as soft X-rays is projected upon the mask with a substantial angle of inclination, as shown in FIG. 5, there occurs "half shade" (23 in FIG. 5) on the surface of the reflective portion of the mask, due to the thickness of the mask pattern. The present embodiment can minimize such half shade.

In FIG. 5, denoted at 21 are non-reflective elements patterningly formed on a reflective base portion of a multilayered film structure. Denoted at 20 are reflecting portions, and denoted at 25 is a substrate.

It will be readily understood from FIG. 5 that the half shade 23 can be reduced by reducing the thickness (height) of the non-reflective pattern 21. Actually, however, to do so might be very difficult since an ordinary X-ray absorbing material does not have a high X-ray absorbing efficiency so that a substantial thickness is required for the material to provide a sufficient X-ray absorbing function.

In the embodiment shown in FIG. 4, the non-reflective pattern is provided by a multilayered film structure which is arranged so that, by the interference effect, the light reflected from the upper surface of a first layer (such as $d_1$) and the light reflected from the upper surface of a second layer (such as $d_2$) act upon one another to mutually weaken the intensity. The layer thickness is determined for this purpose. As a result, the non-reflective portion D can function as an anti-reflection film.

It has been confirmed that the non-reflective portion D of the multilayered structure can be reduced in thickness significantly while retaining high non-reflection efficiency, as compared with that of a non-reflective portion simply made of an X-ray absorbing material.

Referring back to FIG. 4, the mask of the present embodiment has a reflective base portion 10 comprising a multilayered film showing reflectivity to soft X-rays or otherwise. The reflective portion 10 is formed on a non-reflective flat substrate 1 made of a material absorbing soft X-rays or otherwise. The non-reflective portion D comprises a multilayered film and is formed on the reflective portion 10, to thereby provide a predetermined pattern.

The reflective portion 10 is formed by layering two different materials having different optical constants to provide first type layers 2, 4, 6, ..., and second type layers 3, 5, 7, ..., in an alternate fashion.

The thicknesses $d_1, d_2, d_3, d_4, \ldots,$ of the two types of layers are not less than 10Å. Each type of the layers may have the same thickness (i.e. $d_1 = d_3 = \ldots$, and $d_2 = d_4 = \ldots,$). Alternatively, all the layers may have different thicknesses.

However, in consideration of (i) reduction in amplitude of the soft X-rays or vacuum ultraviolet rays due to the absorption thereof by each layer and (ii) mutual intensification of reflected lights due to the overlap of the phases of the reflected lights, at the interfaces of the layers, it is desirable to determine the thickness so that the highest reflection factor is obtainable by the reflective portion as a whole. When the thickness of each layer is less than 10Å it is difficult to achieve a high reflection factor at the reflective portion because of the dispersion effect of the two materials at the interface. This is undesirable. With the increase in the number of layers, the reflection factor can be improved. On the other hand, however, there will occur a difficulty in relation to the manufacture. Accordingly, the number of the layers may preferably be not greater than two hundred.

The non-reflective portion D comprises alternately provided layers made of different materials and constitutes an anti-reflection film to the reflective portion 10. The thicknesses $d_1, d_2, d_3, d_4, \ldots$, of the layers forming the non-reflective portion D are not less than 10 Å. Alternating layers may have the same thickness (i.e. $d_1 = d_3 = \ldots$, and $d_2 = d_4 = \ldots$,). Alternatively, all the layers may have different thicknesses.

It is desirable that a reflection type mask has an intensity ratio of 2:1, preferably 10:1, with respect to the intensities of the soft X-rays or otherwise reflected by the reflective portion 10 and the non-reflective portion D, respectively. For this reason, the anti-reflection film may preferably be formed by two or more layers, although the number intimately depends upon the wavelength range to be used. For the soft X-rays or otherwise of a wavelength near 100Å, for example, the provision of three or more layers is preferable.

From equation (1) related to the Bragg diffraction theory, it is seen that the following condition should be satisfied in order that a layered film can function as an anti-reflection film:

$$2(n_1 d_1 + n_2 d_2) \cos\theta = \lambda(2m+1)/2$$

wherein m is an integral number.

From this, it is seen that each layer of the anti-reflection film has a thickness approximately on an order of $\lambda/4n$ wherein $\lambda$ is the wavelength and n is the refractive index.

Description will now be made of a particular example of a mask according to the second embodiment. The mask of this example may be suitably used with the wavelength of 124Å and with the angle of incidence $\theta$ of 10 degrees.

Figure 6A:
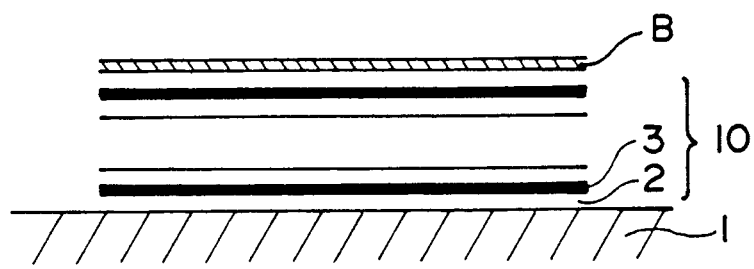
FIGS. 6A–6C are schematic sections, respectively, for explaining the process of manufacture of the mask of the second embodiment.

In this example, a silicon single crystal plate which has been ground to a surface roughness not greater than 10Å (rms) was used as the substrate 1 (FIG. 6A). As the material of the first type layers $2, 4, 6, \ldots$, molybdenum (Mo) having a refractive index $N = 0.95 + 8.9 \times 10^{-3}i$, a linear expansion coefficient of $5.0 \times 10^{-6} K^{-1}$ and heat conductivity of 139 w/mK, was used. On the other hand, as the material of the second type layers $3, 5, 7, \ldots$, silicon (Si) having a refractive index $N = 1.03 + 1.5 \times 10^{-3}i$, a linear expansion coefficient of $2.5 \times 10^{-6} K^{-1}$ and a heat conductivity of 168 w/mK, was used. After a super high vacuum not greater than $1 \times 10^{-6}$ Pa was achieved, forty-one layers (twenty-one layers of Mo and twenty layers of Si) were formed on the substrates with a thickness 27Å (for each first type layer Mo) and a thickness 38.9Å (for each second type layer Si), by sputtering deposition while maintaining an argon pressure of $5 \times 10^{-2}$ Pa. Thus, the reflective base portion 10 was formed. Subsequently, a carbon layer was formed on the reflective portion 10 as a protection film B. The thicknesses were determined in the same manner as in the examples described hereinbefore.

In this example, the selection of materials is made so that the first type layers (Mo) have a refractive index whose real number portion is smaller while the second type layers (Si) have a refractive index whose real number portion is larger.

Figure 6B:
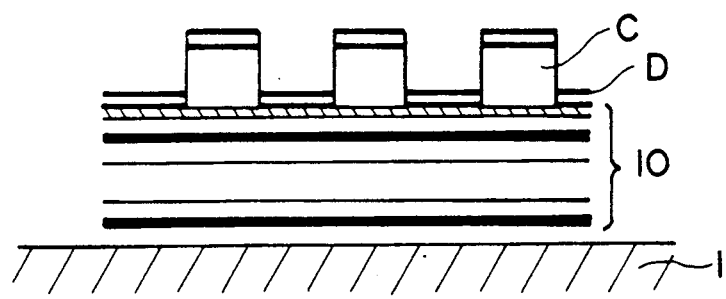

Subsequently, as shown in FIG. 6B, a layer of a resist material PMMA was formed on the reflective portion 10 with a thickness 0.5 micron. Then, by electron beam patterning, the PMMA layer was patterned with 1.75 micron line-and-space. As a result, a patterned resist layer of PMMA was obtained.

Upon the thus formed PMMA resist pattern, silicon (Si) and molybdenum (Mo) were alternately deposited by sputtering deposition to form thirteen alternate layers of Si and Mo having thicknesses 71Å, 37Å, 31Å, . . . , 36Å, 32Å, 36Å and 33Å. The conditions of the sputtering deposition were the same as those at the time of manufacture of the reflective portion 10. The thicknesses are those that satisfy "$\lambda/4n$" described hereinbefore.

Figure 6C:
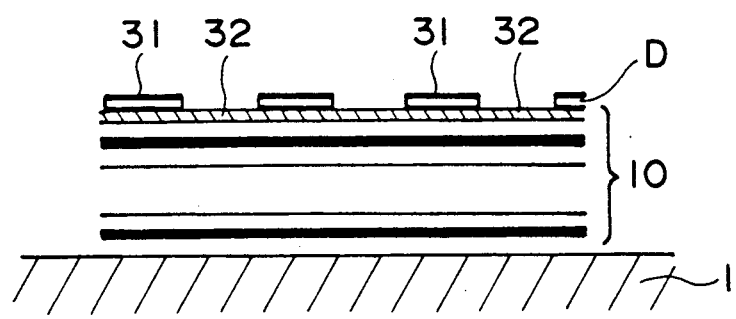

Subsequently, the resist material was removed, with the result that non-reflective elements 31 of multilayered film structure were formed on the reflective portion 10 (FIG. 6C). The thickness of the non-reflective portion 31 as a whole was 480Å.

In order to confirm the anti-reflection effect of the non-reflective portion to the reflective portion, at the time of the sputtering deposition during the manufacture of the reflection type mask (at the time of formation of the reflective portion and the non-reflective portion), reference samples were also placed in a deposition apparatus. At the time of formation of the reflective portion, three reference samples were set and, at the time of formation of the non-reflective portion, one of them was set again. This was done to allow measurement of the reflection factor of a reflective portion and the reflection factor of a reflective portion having a non-reflective portion formed thereon. By the measurement with a wavelength 130Å and with an angle of incidence of 10 degrees, it was confirmed that the former has a reflection factor of 52% and the latter has a reflection factor of 28%.

In order to confirm the thickness which might be required if the non-reflective portion is formed simply by an absorptive material, examination has been made. For this examination, molybdenum (Mo) was deposited on the reflective portion of a reference sample to a thickness 3000Å and the reflection factor was measured under the same conditions described hereinbefore. The reflection factor of 3.4% was measured. Thus, it has been confirmed that an absorption layer of a large thickness is required if the non-reflective portion is formed only by an absorptive material.

Description will now be made of a second example of a mask according to the second embodiment of the present invention. The mask of this example may be suitably used with a wavelength of 124Å.

In a similar manner as the example of FIGS. 6A-6C, a reflective portion 10 was formed on a substrate 1. Further, a pattern of a predetermined configuration was formed on the reflective portion by use of a resist material PMMA. Then, after a high vacuum not greater than $1 \times 10^{-6}$ Pa was achieved, carbon (C) having a refractive index $N = 0.97 + 5.2 \times 10^{-3}i$, a linear expansion coefficient $3.8 \times 10^{-6} K^{-1}$ and a heat conductivity 130 w/mK and tungsten (W) having a refractive index $N = 0.95 + 3.9 \times 10^{-2}i$, a linear expansion coefficient $5 \times 10^{-6} K^{-1}$ and a heat conductivity 178 w/mK, were alternately deposited by sputtering deposition while maintaining an argon pressure of $5 \times 10^{-2}$ Pa, such that a non-reflective portion comprising six layers having thicknesses 73Å, 108Å, 29Å, 38Å, 30Å and 40 , was formed. The thicknesses were determined in the same manner as the foregoing example. Subsequently, the resist material PMMA was removed, with the result that a mask having a reflective portion of multilayered film structure and a non-reflective portion formed on the reflective portion and having a multilayered film structure, was obtained. The thickness of the non-reflective portion as a whole was 318Å.

Also in this example, reference samples were prepared so as to confirm the anti-reflection effect of the non-reflective portion. For the reflective portion, a reflection factor of 52% was measured with a wavelength 130Å and an angle of incidence of 1.0 degree. For the non-reflective portion formed on the reflective portion, a reflection factor 3.2% was measured. On the other hand, for an absorptive element provided by depositing tungsten on the surface of the reflective portion of the sample with a thickness 720Å, a reflection factor of 4.7% was measured. Thus, it was confirmed that, in order that an absorptive element made of an absorptive material provides substantially the same effect as of a non-reflective portion made of a multilayered film, the absorptive element must have a thickness twice or more greater than the thickness of the non-reflective portion of the multilayered film structure.

In the examples of the second embodiment, the protection film provided on the upper surface of the reflective portion is preferably made by a carbon layer of a thickness not greater than 100Å. However, such a protection film may be omitted.

While, in the present embodiment, the multilayered structure of the reflective portion is formed by alternately layering two different materials, three or more materials may be used and layered in sequence.

Further, while a silicon single crystal plate is used in the present embodiment as a substrate, the material is not limited thereto. A glass plate, a fused silica plate, a silicon carbide plate or otherwise may be used, provided that its surface is made sufficiently smooth, by grinding, as compared with the wavelength to be used.

Figure 7:
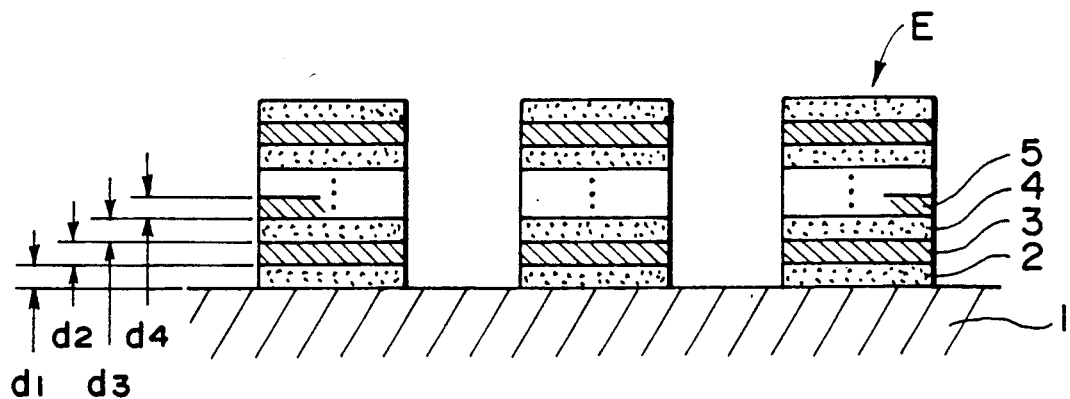
FIG. 7 is a schematic section showing the structure of a reflection type mask according to a third embodiment of the present invention.

FIG. 7 shows a reflection type mask according to a third embodiment of the present invention. While, in the foregoing embodiments, the mask has a reflective base portion of multilayered film structure and the surface of the reflective base portion is patterned with a non-reflective portion, the reflection type mask of the present embodiment comprises a non-reflective base portion patterned with a reflective portion of multilayered film structure. This will now be described in more detail.

In FIG. 7, denoted at E are reflective elements that form a pattern to be transferred onto the surface of a workpiece. Each reflective portion comprises a multilayered film having a reflectivity to soft X-rays or otherwise. These reflective portions are formed in a desired geometrical configuration upon a non-reflective flat substrate 1 which is made of a material absorbing soft X-rays or otherwise. Thus, these reflective portions provide a desired pattern on the mask. Each reflective portion E is formed by alternately layering two different materials having different optical constants. Namely, the first type layers 2, 4, 6, ..., made of a first material and the second type layers 3, 5, 7, ..., made of a second material were disposed alternately in a layered fashion.

The thicknesses $d_1, d_2, d_3, d_4, \ldots$, of the layers of the reflective portion E are not less than 10Å. Each type of layers may have the same thickness (i.e. $d_1 = d_3 = \ldots$, and $d_2 = d_4 = \ldots$,). Alternatively, all the layers may have different thicknesses.

However, in consideration of (i) reduction in amplitude of the soft X-rays or vacuum ultraviolet rays due to the absorption thereof by each layer and (ii) mutual intensification of reflected lights due to the overlap of the phases of the reflected lights, at the interfaces of the layers, it is desirable to determine the thickness so that the highest reflection factor is obtainable by the reflective portion as a whole. When the thickness of each layer is less than 10Å, it is difficult to achieve high reflection factor at the reflective portion because of the dispersion effect of the two materials at the interface. This is undesirable. With the increase in the number of layers, the reflection factor can be improved. On the other hand, however, there will occur a difficulty in relation to the manufacture. Accordingly, the number of the layers may preferably be not greater than two hundred.

A particular example of a mask according to the third embodiment will now be described. The mask of this example may be suitably used with a wavelength of 124Å and with an angle of incidence $\theta = 0$ (degree).

A substrate 1 (FIG. 8A) was made of CVD silicon carbide having a heat expansion coefficient not greater than $4.5 \times 10^{-6}$/K and a heat conductivity 100 w/mK. The substrate 1 had a surface having been ground to a surface roughness not greater than 10Å (rms). On the substrate 1, a layer of resist material PMMA was formed with a thickness of 0.5 micron. Then, by electron-beam patterning, the PMMA layer was patterned with 1.75 micron line-and-space.

Figure 8A:
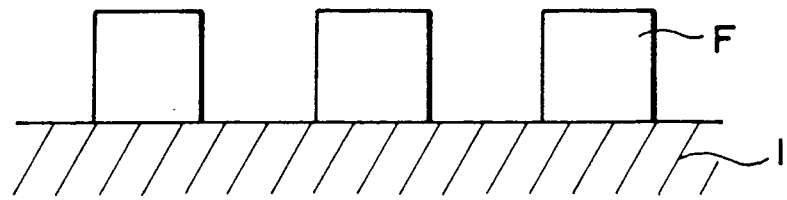
FIGS. 8A–8C are schematic sections, respectively, for explaining the process of manufacture of the third embodiment.

On the thus formed patterned PMMA resist layer denoted at F in FIG. 8A, molybdenum (Mo) having a refractive index $N = 0.93 + 8.9 \times 10^{-3}i$, a linear expansion coefficient $5.0 \times 10^{-6} K^{-1}$ and a heat conductivity 139 w/mK and silicon (Si) having a refractive index $N = 1.03 + 1.5 \times 10^{-3}i$, a linear expansion coefficient $2.5 \times 10^{-6} K^{-1}$ and a heat conductivity 168 w/mK were alternately deposited to provide first type (Mo) layers 2, 4, 6, ..., and second type (Si) layers 3, 5, 7, .... The deposition was made after a super high vacuum not greater than $1 \times 10^{-6}$ Pa was achieved and while maintaining an argon pressure of $5 \times 10^{-2}$ Pa, and by means of sputtering deposition. Forty-one layers (twenty-one layers of Mo and twenty layers of Si) were formed in a multi-layered fashion with a thickness of 27Å (for each first type layer Mo) and a thickness 38Å (for each second type layer Si). The thicknesses were determined in the same manner as in the foregoing examples.

Figure 8B:
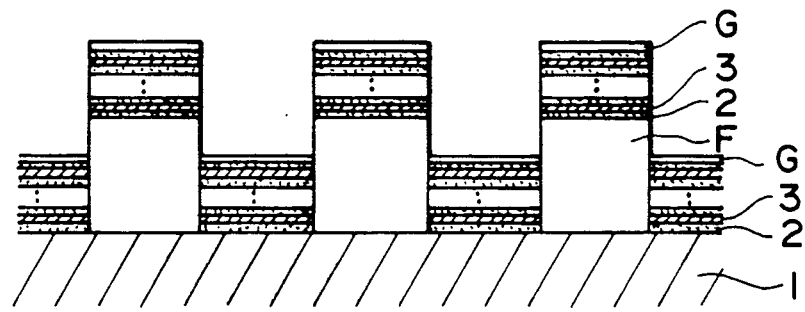

Subsequently, on the layered structure, carbon (C) was additionally layered with a thickness of 10Å, as a protection film G (FIG. 8B). Thus, as shown in FIG. 8B, reflective multilayered film structures were formed on the substrate 1 and on the resist pattern F.

Figure 8C:
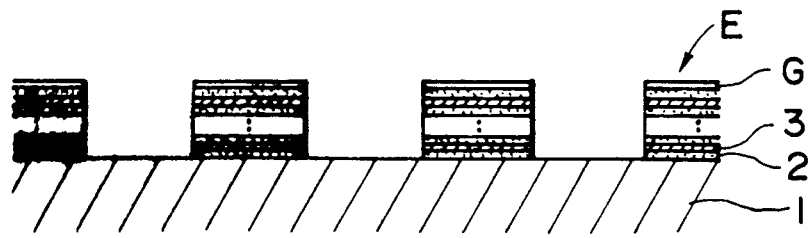

Next, the patterned resist material PMMA was removed to provide non-reflective portions. As a result, a mask having a non-reflective substrate having a surface patterned with reflective portions E of multilayered structure, was obtained as illustrated in FIG. 8C.

In this example, the selection of materials is made so that the first type layer (Mo) has a refractive index whose real number portion is smaller while the second type layer (Si) has a refractive index whose real number portion is larger.

While, in the present (third) embodiment, two different materials are layered alternately to provide the reflective portion of multilayered structure, three or more materials may be layered in sequence.

Figure 9A:
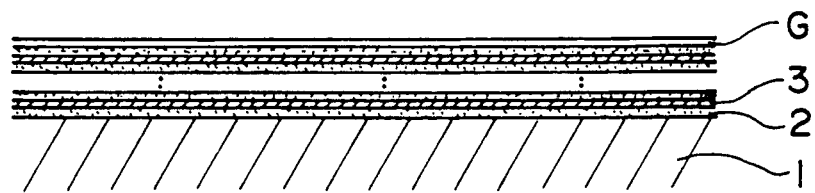
FIGS. 9A and 9B are schematic sections, respectively, for explaining another example of the manufacturing process for the mask of the third embodiment.

Another example of a mask according to the third embodiment, which can be manufactured in a different manner, will now be described taken in conjunction with FIGS. 9A and 9B. The mask of this example may be suitably used with a wavelength 124Å and an angle of incidence $\theta = 0$ (degree).

As in the foregoing example, a silicon carbide plate having a ground surface was used as a substrate 1. On the substrate 1, molybdenum (Mo) having a refractive index $N = 0.93 + 8.9 \times 10^{-3}i$ and silicon (Si) having a refractive index $N = 1.03 + 1.5 \times 10^{-3}i$ were deposited alternately by sputtering deposition, after a super high vacuum not greater than $1 \times 10^{-6}$ Pa was achieved and while maintaining an argon pressure of $5 \times 10^{-2}$ Pa, such that forty-one layers (twenty-one layers of Mo and twenty layers of Si) were formed with a thickness 27Å (for each first type layer Mo) and a thickness 38Å (for each second type layer Si). Additionally, carbon (C) was deposited to a thickness of 10Å as a protection film G, whereby a reflective base portion of multilayered film structure was obtained (FIG. 9A). The thickness of each layer was determined in a similar manner as in the foregoing embodiments.

Figure 9B:
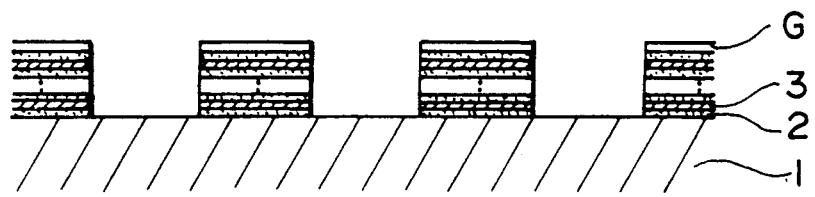

The thus formed multilayered reflective portion was subjected to an etching treatment by a convergent ion beam using $Au^{2+}$ and having a beam diameter of 0.2 micron, under an acceleration voltage 80 KV and an ion current $0.5 \times 10^{-8}$ A, with the result that the reflective portion was patterned to 1.85 micron line-and-space (FIG. 9B).

Figure 10:
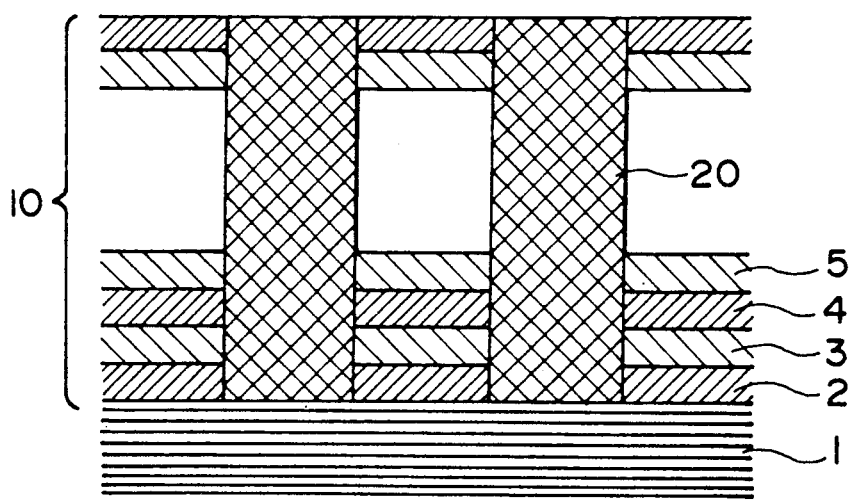
FIG. 10 is a schematic section showing the structure of a reflection type mask according to a fourth embodiment of the present invention.

FIG. 10 shows the structure of a reflection type mask according to a fourth embodiment of the present invention.

Briefly, in the present embodiment, a mask pattern is formed by selectively irradiating a reflective base portion of multilayered film structure with a particular radiation beam so as to change the physical and/or chemical characteristics of the reflective portion to thereby destroy the regularity of the multilayered structure in the portion irradiated by the radiation beam.

A particular example of a reflection type mask according to the present embodiment will be described. The mask of this example may be suitably used with a wavelength of 124Å and an angle of incidence $\theta = 0$ (degree).

As a substrate 1, a ground quartz plate having a surface roughness not greater than 2Å (rms) was used. On the substrate 1, molybdenum (Mo) having a refractive index $N = 0.93 + 8.9 \times 10^{-3}i$, a linear expansion coefficient $5.0 \times 10^{-6}$ $K^{-1}$ and a heat conductivity 139 w/mK and silicon (Si) having a refractive index $N = 1.03 + 1.5 \times 10^{-3}i$ were deposited alternately by ion-beam sputtering deposition, in a high vacuum not greater than $5 \times 10^{-7}$ Torr while maintaining an argon pressure of $2 \times 10^{-4}$ Torr and by use of a rock crystal oscillator type film thickness monitor. Forty-one layers (twenty-one layers of Mo and twenty layers of Si) were formed in an alternately layered fashion to provide first type layers 2, 4, 6, ..., made of Mo and second type layers 3, 5, 7, ..., made of Si. The thickness of each of the first type layers (Mo) was 27Å and the thickness of each of the second type layers (Si) was 36Å. The thickness was determined similarly as in the examples described hereinbefore.

In this example, the selection of materials for the first and second layers has been made so that the first type layers (Mo) have a refractive index whose real number portion is smaller while the second type layers (Si) have a refractive index whose real number portion is larger.

Next, by using a converging ion-beam scanning apparatus, the thus formed reflective portion comprising a multilayered film was irradiated with a focused silicon ion beam having a focused beam diameter of 0.1 micron under an acceleration voltage 200 Kev. As a result, the regularity of the layered structure of the part of the reflective portion 10 irradiated with the ion beam was destroyed so that the irradiated part of the reflective portion 10 lost the function of a "reflecting surface". In the manner described, a plurality of non-reflective portions were formed in the reflective portion 10 and a pattern of 0.8 micron line-and-space was obtained. The beam current was 100 PA.

Measurements were made with regard to the reflection factors at the positions corresponding to the reflective portion and the non-reflective portion of the obtained reflection type mask, and it was confirmed that the former had a reflection factor of 48% and the latter had a reflection factor of 0.8%. Thus, the contrast was 60:1.

Another example of a mask according to the fourth embodiment of the present invention will now be described. The mask of this example may be suitably used with a wavelength of 124Å and an angle of incidence $\theta = 0$ (degree).

As in the foregoing example, a ground quartz plate was used as a substrate 1 and, on that substrate, first type layers 2, 4, ..., made of ruthenium (Ru) having a refractive index $N = 0.91 + 6.8 \times 10^{-3}i$ and second type layers 3, 5, ..., made of silicon (Si) having a refractive index $N = 1.03 + 1.5 \times 10^{-3}i$ were formed in an alternate fashion, in a super high vacuum not greater than $1 \times 10^{-9}$ Torr by means of electron-beam deposition and by use of a rock-crystal oscillator type film thickness monitor. Forty-one layers (twenty-one layers of Ru and twenty layers of Si) were formed with a thickness 27Å (for each Ru layer) and a thickness 36Å (for each Si layer). The thickness was determined in the same manner as in the foregoing example.

Next, the thus obtained reflective portion of multilayered film structure was selectively irradiated with a focused argon laser beam with an output power of 5 W. As a result, the regularity of the layered structure of the part of the reflective portion irradiated with the laser beam was destroyed so that the irradiated part lost the function as a "reflecting surface". In the manner described, non-reflective portions were formed in the reflective portion and a pattern of 1 micron line-and-space was obtained.

The means for destroying the regularity of the layered structure is not limited to the converging ion-beam scanning apparatus or the use of a laser beam. For example, an electron beam may be used. It is a further alternative that a resist pattern is first formed on a multilayered film and a glass plasma is used to destroy the regularity of the layered structure, the resist material being thereafter removed.

It should be noted that a reflection type mask will be used, in many cases, with an intense X-ray source such as, for example, a light source means using a synchrotron emission light source. Thus, it will be necessary to consider the problem of a temperature increase due to the absorption of radiation energy by the mask. Particularly, the thermal expansion due to the temperature increase will cause shift of the position of a pattern on the mask surface or distortion of the mask pattern. This is a very serious problem in the reproduction of patterns having a submicron linewidth.

In consideration of this, it will be desirable to suppress any temperature increase in the reflection type mask due to the absorption of soft X-rays or otherwise by the mask.

In the reflection type mask according to any one of the above-described embodiments, a bulk material may be used as the substrate. Thus, the mask itself can be cooled by water or otherwise. Therefore, it is possible to diminish, remarkably, the adverse effect of the temperature increase in the mask. Further, by using a material (examples of which will be described later) having a high heat conductivity as for the substrate and the multilayered film, the heat can be radiated efficiently with an advantageous effect of prevention of the temperature increase.

Moreover, in the embodiments described hereinbefore, a material (examples of which will be described later) having a small linear expansion coefficient may be used as the substrate and the multilayered film. This is effective to suppress the occurrence of distortion due to the temperature increase.

As for the material of the substrate which may be used preferably, there are silicon carbide, aluminum nitride, silicon nitride of ceramics series, for example. Particularly, the silicon carbide is preferable because it has a very large heat conductivity (of an order of 100 w/mK). As for the material usable in the multilayered film as one type layer, there are transition metals such as tungsten, tantalum, molybdenum, rhodium, ruthenium or otherwise, carbide, nitride, silicide, boride, oxide or otherwise of any one of the aforementioned transition metals. As for the material which may be used as the other type layer, there are silicon, beryllium, carbon, boron, composites of these materials (e.g. silicon carbide, boron carbide), oxide, nitride or otherwise of these materials such as silicon oxide, silicon nitride and so on.

Particularly, the silicon carbide has a linear expansion coefficient of not greater than $4.5 \times 10^{-6}$ K$^{-1}$ and the tungsten has a linear expansion coefficient of not greater than $4.5 \times 10^{-6}$ K$^{-1}$, so that they are preferable. Further, molybdenum usable as the material of the reflective portion has a linear expansion coefficient of not greater than $4.8 \times 10^{-6}$ K$^{-1}$, and therefore molybdenum is a preferable material.

In the embodiments described hereinbefore, it is preferable to use a material having a linear expansion coefficient not greater than $1 \times 10^{-5}$/K and a heat conductivity not less than 20 w/mK, as for the material of the substrate, the material of the reflective portion and the material of the non-reflective portion.

The manufacture of the multilayered film is not limited to use of the ion-beam sputtering method or the electron-beam deposition method using a super high vacuum. Any other thin film manufacturing technique such as a double-electrode sputtering method, organic metal chemical vapor deposition method (called "Mo-CVD method") or otherwise.

In the embodiments described hereinbefore, if it is desired to correct any "curvature of field" which might be caused in the imaging optical system such as illustrated in FIG. 1, the mask may be formed so that the substrate thereof has a curved surface such as, for example, a spherical surface, an aspherical surface, an asymmetrically curved surface or otherwise.

While the invention has been described with reference to the structures disclosed herein, it is not confined to the details set forth and this application is intended to cover such modifications or changes as may come within the purposes of the improvements or the scope of the following claims.

What is claimed is:

1. A reflection type mask usable in an exposure apparatus for transferring a pattern of the mask onto a workpiece coated with a sensitive material, by use of radiation such as soft X-rays or vacuum ultraviolet rays, said mask comprising:
    a reflective portion formed by a multilayered film; and
    a non-reflective portion formed on said reflective portion to provide a pattern, wherein said non-reflective portion is provided by an anti-reflection film having a multilayered structure.

2. A reflection type mask according to claim 1, wherein each layer in the multilayered structure of said non-reflective portion has a thickness approximately of an order of $\lambda/4n$ where $\lambda$ is the wavelength of radiation to be used with said mask and n is the refractive index.

3. A reflection type mask usable in an exposure apparatus for transferring a pattern of the mask onto a workpiece coated with a sensitive material, by use of radiation such as soft X-rays or vacuum ultraviolet rays, said mask comprising:
    a reflective portion formed by a multilayered film; and
    a non-reflective portion formed on said reflective portion to provide a pattern, wherein said non-reflective portion is made of a material which is effective to absorb soft X-rays or vacuum ultraviolet rays and wherein said absorbing material of said non-reflective portion has a linear expansion coefficient not greater than $5 \times 10^{-5}$ deg$^{-1}$ and a heat conductivity not less than 0.1 J/cm.s.deg.

4. A reflection type mask usable in a semiconductor device manufacturing exposure apparatus for transferring a pattern of the mask onto a workpiece coated with a sensitive material by use of radiation such as soft X-rays or vacuum ultraviolet rays, said mask comprising:
    a substrate which is non-reflective to soft X-rays or vacuum ultraviolet rays to be used in the exposure apparatus, wherein said substrate is made of a material having a linear expansion coefficient not greater than $1 \times 10^{-3}$/K and a heat conductivity not less than 20 w/mK; and
    a reflective portion comprising a multilayered film being formed on said substrate to provide a pattern.

5. A reflection type mask usable with an imaging optical system having an optical characteristic and for forming an image of the mask on a workpiece, said mask comprising:
    a substrate comprising a curved surface for complementing the optical characteristic of the imaging optical system, said substrate being non-reflective to radiation energy; and
    a pattern formed on the surface of said substrate being provided by a multilayered thin film reflective to the radiation energy.

6. A reflection type mask according to claim 5, wherein said curved surface of said substrate complements curvature of field as the optical characteristic of the imaging optical system being complemented.

7. A reflection type mask usable with an imaging optical system having an optical characteristic and for forming an image of the mask on a workpiece, said mask comprising:

a substrate comprising a curved surface for complementing the optical characteristic of the imaging optical system;

a reflective portion formed on the surface of said substrate being provided by a multilayered thin film reflective to radiation energy; and a non-reflective portion formed on said reflective portion being non-reflective to the radiation energy, said non-reflective portion cooperating with said reflective portion to provide a pattern.

8. A reflection type mask according to claim 7, wherein said curved surface of said substrate complements curvature of field as the optical characteristic of the imaging optical system being complemented.

9. A reflection type mask, comprising:

a reflective portion having a multilayered structure in which different materials showing different optical constants with regard to soft X-ray and/or vacuum ultraviolet rays are layered alternately; and a non-reflective portion formed in said reflective portion to provide a pattern, wherein the regularity of the multilayered structure is destroyed in said non-reflective portion.

10. A method of manufacturing a reflection type mask, said method comprising the steps of:

alternately layering different materials showing different optical constants with respect to at least one of soft X-rays and vacuum ultraviolet rays to provide a reflective portion of a multilayered structure; and destroying the regularity of the multilayered structure of a part of the reflective portion, in accordance with the geometrical configuration of a pattern to be formed on the mask, so as to provide a non-reflective portion.

11. A method according to claim 10, wherein at least one of a converging ion beam and a laser beam is used to destroy the regularity of the multilayered structure.

12. A method of manufacturing semiconductor devices, comprising the steps of:

preparing a reflection type mask including a pattern defined by (i) a reflecting portion formed with a multilayered film, and (ii) a non-reflecting portion comprising a multilayered film formed on the reflecting portion; and irradiating the mask with radiation, and exposing a radiation sensitive material on a semiconductor wafer to radiation reflected by the mask, whereby the pattern of the mask is transferred to the wafer.

13. A method according to claim 12, further comprising irradiating the mask with soft X-rays.

14. A method according to claim 12, further comprising irradiating the mask with vacuum ultraviolet rays.

15. A method of manufacturing semiconductor devices, comprising the steps of:

preparing a reflection type mask including a pattern defined by (i) a reflecting portion formed with a multilayered film, and (ii) a non-reflecting portion made of a material effective to absorb radiation, and having a linear expansion coefficient not greater than $5 \times 10^{-5}$/deg and a heat conductivity not less than 0.1 J/cm.s.deg; and irradiating the mask with radiation, and exposing a radiation sensitive material on a semiconductor wafer to radiation reflected by the mask, whereby the pattern of the mask is transferred to the wafer.

16. A method according to claim 15, further comprising irradiating the mask with soft X-rays.

17. A method according to claim 15, further comprising irradiating the mask with vacuum ultraviolet rays.

18. A method of manufacturing semiconductor devices, comprising the steps of:

preparing a reflection type mask including a pattern defined by (i) a reflecting portion formed with a multilayered film, and (ii) a non-reflecting portion made of a material effective to absorb radiation, and having a linear expansion coefficient not greater than $5 \times 10^{-5}$/K and a heat conductivity not less than 20 W/mK, wherein the reflecting portion is provided on the non-reflecting portion; and irradiating the mask with radiation, and exposing a radiation sensitive material on a semiconductor wafer to radiation reflected by the mask, whereby the pattern of the mask is transferred to the wafer.

19. A method according to claim 18, further comprising irradiating the mask with soft X-rays.

20. A method according to claim 18, further comprising irradiating the mask with vacuum ultraviolet rays.

21. A method of manufacturing semiconductor devices, comprising the steps of:

preparing a reflection type mask including a substrate made of a material effective to absorb radiation, and a pattern formed on the substrate with a multilayered film for reflection of the radiation, the substrate having curved surface effective to compensate for an optical characteristic of an imaging optical system; and irradiating the mask with radiation, and exposing a radiation sensitive material on a semiconductor wafer to radiation reflected by the mask and influenced by the imaging optical system, whereby the pattern of the mask is transferred to the wafer.

22. A method according to claim 21, further comprising irradiating the mask with soft X-rays.

23. A method according to claim 21, further comprising irradiating the mask with vacuum ultraviolet rays.

24. A method of manufacturing semiconductor devices, comprising the steps of:

preparing a reflection type mask including a substrate having a curved surface effective to compensate for an optical characteristic of an imaging optical system, and a pattern defined by a reflecting portion formed with a multilayered film effective to reflect radiation and a non-reflecting portion not reflective to radiation; and irradiating the mask with radiation, and exposing a radiation sensitive material on a semiconductor wafer to radiation reflected by the mask and influenced by the imaging optical system, whereby the pattern of the mask is transferred to the wafer.

25. A method according to claim 24, further comprising forming the reflecting portion on the substrate, and the non-reflecting portion on the reflecting portion.

26. A method according to claim 24, further comprising irradiating the mask with soft X-rays.

27. A method according to claim 24, further comprising irradiating the mask with vacuum ultraviolet rays.

28. A method of manufacturing semiconductor devices, comprising the steps of:

preparing a reflection type mask including a pattern defined by (i) as reflecting portion formed with a multilayered film, and (ii) a non-reflecting portion formed by a portion of the reflecting portion, in which portion regularity of the multilayered film is destroyed; and irradiating the mask with radiation, and exposing a radiation sensitive material on a semiconductor wafer to radiation reflected by the mask, whereby the pattern of the mask is transferred to the wafer.

29. A method according to claim 28, further comprising irradiating the mask with soft X-rays.

30. A method according to claim 28, further comprising irradiating the mask with vacuum ultraviolet rays.

* * * * *

UNITED STATES PATENT AND TRADEMARK OFFICE
CERTIFICATE OF CORRECTION

PATENT NO. : 5,052,033  
DATED : September 24, 1991  
INVENTOR(S) : Tsutomu Ikeda, et al.

Page 1 of 4

It is certified that error appears in the above-identified patent and that said Letters Patent is hereby corrected as shown below:

ON THE TITLE PAGE

IN U.S. PATENT DOCUMENTS

"Keen et al." should read --Keem et al.--.

IN THE DISCLOSURE

COLUMN 1

Line 17, "5Å-300Åor" should read --5Å-300Å or--;
Line 18, "the" (first occurrence) should read --a--; and
Line 55, "mask" should read --the mask--.

COLUMN 3

Line 22, "1987" should read --1987,--; and
Line 38, ", are" should read --are--.

UNITED STATES PATENT AND TRADEMARK OFFICE
CERTIFICATE OF CORRECTION

PATENT NO. : 5,052,033

DATED : September 24, 1991

INVENTOR(S) : Tsutomu Ikeda, et al.

It is certified that error appears in the above-identified patent and that said Letters Patent is hereby corrected as shown below:

COLUMN 4

Line 6, "$(2M)\lambda/2$" should read --$(2m)\lambda/2$--;
Line 15, "$n_1d_1+_2d_2$" should read --$n_1d_1+n_2d_2$--; and
Line 65, "$\lambda=0$" should read --$\theta=0$--.

COLUMN 6

Line 28, "$d_1$)" should read --$\tilde{d}_1$)--;
Line 29, "$d_2$)" should read --$\tilde{d}_2$)--;
Line 54, ",)." should read --).--; and
Line 64, "10Å" should read --10Å,--.

COLUMN 7

Line 8, "$d_1,d_2,d_3,d_4,\ldots,$" should read --$\tilde{d}_1,\tilde{d}_2,\tilde{d}_3,\tilde{d}_4,\ldots$--;
Line 11, "$d_1=d_3=\ldots$, and $d_2=d_4=\ldots,)$." should read --$\tilde{d}_1=\tilde{d}_3=\ldots$, and $\tilde{d}_2=\tilde{d}_4=\ldots)$.--; and
Line 44, "heat" should read --a heat--.

COLUMN 8

Line 1, "1;75" should read --1.75--; and
Line 65, "40 ," should read --40Å,--.

UNITED STATES PATENT AND TRADEMARK OFFICE
CERTIFICATE OF CORRECTION

PATENT NO. : 5,052,033
DATED : September 24, 1991
INVENTOR(S) : Tsutomu Ikeda, et al.

It is certified that error appears in the above-identified patent and that said Letters Patent is hereby corrected as shown below:

COLUMN 9

Line 67, ",)." should read --).--.

COLUMN 10

Line 39, "7,." should read --7,--; and
Line 40, "..,." should read --...--.

COLUMN 13

Line 50, "as" should be deleted; and
Line 59, "otherwise." should read --otherwise is possible.--.

COLUMN 14

Line 20, "$\lambda$is" should read --$\lambda$ is--.

UNITED STATES PATENT AND TRADEMARK OFFICE
CERTIFICATE OF CORRECTION

PATENT NO. : 5,052,033
DATED : September 24, 1991
INVENTOR(S) : Tsutomu Ikeda, et al.

It is certified that error appears in the above-identified patent and that said Letters Patent is hereby corrected as shown below:

COLUMN 15

Line 18, "X-ray" should read --X-rays--.

COLUMN 16

Line 28, "curved" should read --a curved--; and
    Line 64, "as" should read --a--.

Signed and Sealed this

Sixteenth Day of March, 1993

Attest:

STEPHEN G. KUNIN

Attesting Officer     Acting Commissioner of Patents and Trademarks